US012225765B2

(12) United States Patent
Xiao

(10) Patent No.: US 12,225,765 B2
(45) Date of Patent: Feb. 11, 2025

(54) DISPLAY PANEL AND DISPLAY DEVICE

(71) Applicant: Hubei Yangtze Industrial Innovation Center of Advanced Display Co., LTD., Wuhan (CN)

(72) Inventor: Ai Xiao, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 571 days.

(21) Appl. No.: 17/385,592

(22) Filed: Jul. 26, 2021

(65) Prior Publication Data
US 2022/0384766 A1 Dec. 1, 2022

(30) Foreign Application Priority Data

May 25, 2021 (CN) .......................... 202110569820.2

(51) Int. Cl.
*H10K 50/86* (2023.01)
*H10K 50/856* (2023.01)
*H10K 59/121* (2023.01)
*H10K 59/131* (2023.01)

(52) U.S. Cl.
CPC ......... *H10K 50/865* (2023.02); *H10K 50/856* (2023.02); *H10K 59/121* (2023.02); *H10K 59/131* (2023.02)

(58) Field of Classification Search
CPC ............. H10K 59/8792; H10K 50/865; H10K 59/122; H10K 59/88; H10K 59/121; H01L 51/5284; H01L 27/3246; H01L 27/3223; G02F 1/133512; G02F 1/136209
See application file for complete search history.

(56) References Cited

U.S. PATENT DOCUMENTS

| 2014/0091704 | A1* | 4/2014 | Furuie | H10K 71/00 445/24 |
| 2017/0244069 | A1* | 8/2017 | Kim | H10K 50/844 |
| 2018/0374909 | A1* | 12/2018 | Nishikiori | H10K 59/122 |
| 2020/0201390 | A1* | 6/2020 | Lin | G06F 1/1609 |
| 2022/0299819 | A1* | 9/2022 | Ishikawa | G02F 1/133514 |

FOREIGN PATENT DOCUMENTS

| CN | 110850629 A | | 2/2020 |
| CN | 111061086 A | | 4/2020 |
| CN | 112331078 A | * | 2/2021 |

* cited by examiner

*Primary Examiner* — Joseph C. Nicely
*Assistant Examiner* — E. Rhett Cheek
(74) *Attorney, Agent, or Firm* — Anova Law Group, PLLC

(57) ABSTRACT

A display panel and a display device are provided in the present disclosure. The display panel includes a display region and a non-display region, where the non-display region is on at least one side of the display region. The display panel includes a substrate; a light-emitting unit layer on a side of the substrate, where the light-emitting unit layer includes pixel units, at the display region, arranged in an array; and further includes a light-blocking layer on a side of the light-emitting unit layer away from the substrate, where the light-blocking layer includes first openings and second openings. The first openings are at the display region; along a direction perpendicular to the substrate, the pixel units correspond to the first openings; and the second openings are at least on a side of the non-display region adjacent to the display region.

20 Claims, 13 Drawing Sheets

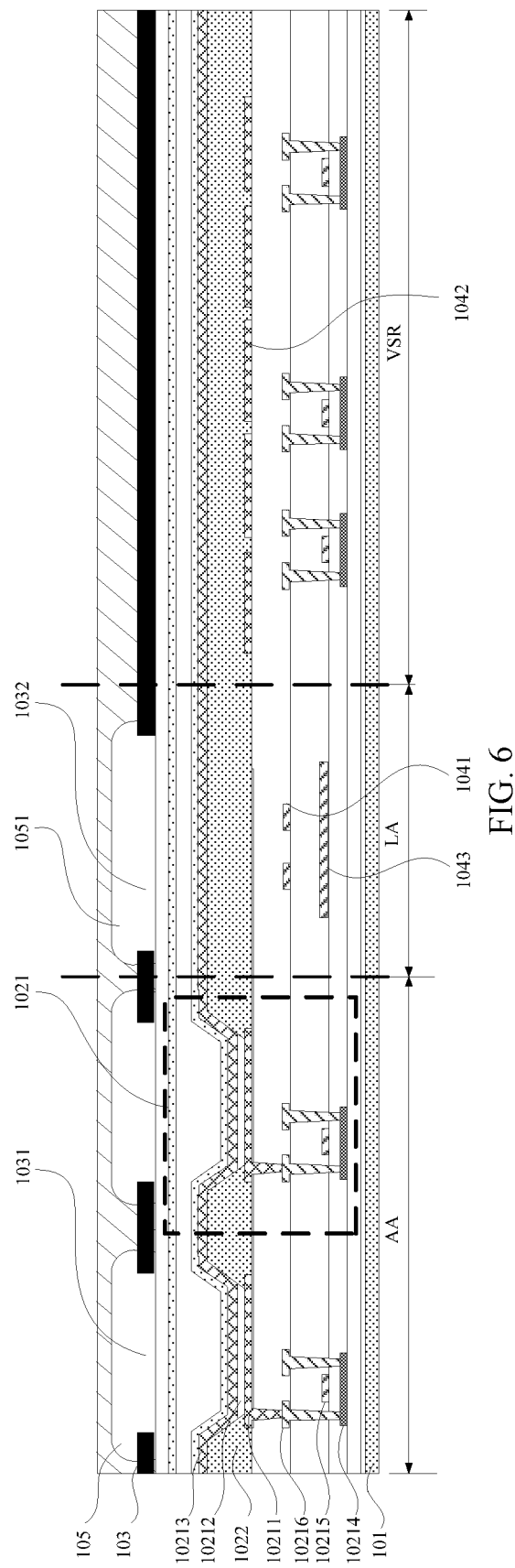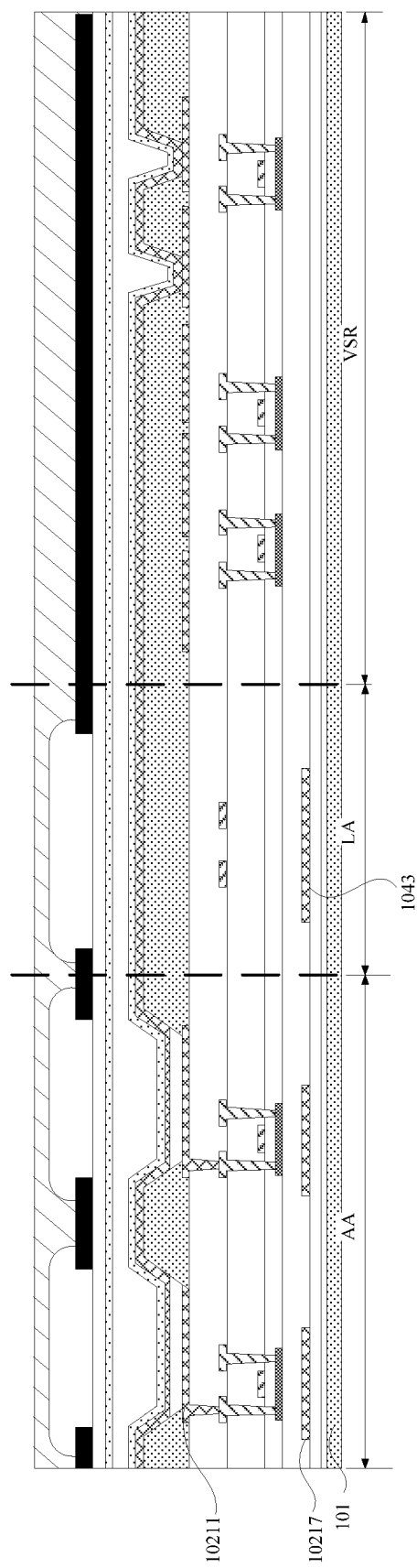
FIG. 6
FIG. 7

DISPLAY PANEL AND DISPLAY DEVICE

CROSS-REFERENCE TO RELATED APPLICATION

This application claims the priority of Chinese Patent Application No. 202110569820.2, filed on May 25, 2021, the content of which is incorporated herein by reference in its entirety.

TECHNICAL FIELD

The present disclosure generally relates to the field of display technology and, more particularly, relates to a display panel and a display device.

BACKGROUND

Organic light-emitting diode (OLED) displays, as a new generation of display devices, have advantages of their thinness and lightness, high contrast, fast response, wide viewing angle, high brightness, full color and the like. Therefore, OLED displays have a tremendously wide application prospect in the field of computers, personal digital assistants (PDAs), digital cameras, vehicle displays, notebook computers, wall-mounted TVs, military fields and the like.

In order to reduce the reflectivity of external light in the organic light-emitting diode display, one solution is to attach a circular polarizer to a light-exiting surface of the organic light-emitting diode display. However, the light exited from the organic light-emitting diode display is also partially absorbed by the circular polarizer, thereby reducing the light-exiting efficiency of the organic light-emitting diode display.

Another solution is to install a color filter on the light-exiting surface of the organic light-emitting diode display. Such configuration can effectively reduce the reflection of ambient light and ensure the light-exiting efficiency of the organic light-emitting diode display. As the color filter application in the organic light-emitting diode displays gradually develops, more existing technologies integrate color filters into display panels, and such configuration can greatly reduce the thickness of the entire display panel. However, due to the process complexity, the flatness differences between layers may accumulate during a stacking process, which may ultimately affect the display effect.

SUMMARY

One aspect of the present disclosure provides a display panel. The display panel includes a display region and a non-display region, where the non-display region is on at least one side of the display region. The display panel includes a substrate; a light-emitting unit layer on a side of the substrate, where the light-emitting unit layer includes pixel units, at the display region, arranged in an array; and a light-blocking layer on a side of the light-emitting unit layer away from the substrate, where the light-blocking layer includes first openings and second openings. The first openings are at the display region, and along a direction perpendicular to the substrate, the pixel units correspond to the first openings; and the second openings are at least on a side of the non-display region adjacent to the display region.

Another aspect of the present disclosure provides a display device. The display device includes a display panel and a driving chip on the display panel. The display panel includes a display region and a non-display region, where the non-display region is on at least one side of the display region. The display panel includes a substrate; a light-emitting unit layer on a side of the substrate, where the light-emitting unit layer includes pixel units, at the display region, arranged in an array; and a light-blocking layer on a side of the light-emitting unit layer away from the substrate, where the light-blocking layer includes first openings and second openings. The first openings are at the display region, and along a direction perpendicular to the substrate, the pixel units correspond to the first openings; and the second openings are at least on a side of the non-display region adjacent to the display region. The display panel further includes a touch-control layer on a side of the light-blocking layer adjacent to the substrate. The touch-control layer and the driving chip are electrically connected with each other through touch-control wires; and along the direction perpendicular to the substrate, the touch-control wires overlap the non-display region. Along a first direction, opening areas of the second openings gradually increase, wherein the first direction is a direction pointing from a side of the display panel adjacent to the driving chip to a side of the display panel away from the driving chip.

The non-display region includes a wiring region and a driving circuit region; the wiring region is adjacent to the display region; the driving circuit region is on a side of the wiring region away from the display region; and the second openings are at least at the wiring region.

Other aspects of the present disclosure can be understood by those skilled in the art in light of the description, the claims, and the drawings of the present disclosure.

The display panel further includes a color resist layer on the side of the light-emitting unit layer away from the substrate. The color resist layer includes color resist units arranged in an array; and along the direction perpendicular to the substrate, a projection of the color resist units on the light-blocking layer at least covers the second openings.

BRIEF DESCRIPTION OF THE DRAWINGS

In order to more clearly explain various embodiments of the present disclosure, the drawings required for describing the embodiments or the existing technology are briefly introduced hereinafter. Obviously, the drawings in the following description are merely some embodiments of the present disclosure. Other drawings may also be obtained by those skilled in the art without any creative work according to provided drawings.

FIG. 6 illustrates a cross-sectional view of another exemplary display panel according to various embodiments of the present disclosure;

FIG. 7 illustrates a cross-sectional view of another exemplary display panel according to various embodiments of the present disclosure;

DETAILED DESCRIPTION

In order to clearly understand the above-mentioned objectives, features and advantages of the present disclosure, the present disclosure is further described below with reference to the accompanying drawings and embodiments.

It should be understood that the described embodiments are only a part of various embodiments of the present disclosure, rather than all of various embodiments. Based on various embodiments of the present disclosure, all other embodiments obtained by those skilled in the art without creative work shall fall within the protection scope of the present disclosure.

The terms used in various embodiments of the present disclosure are only for the purpose of describing specific embodiments, and are not intended to limit the present disclosure. The singular forms of "a", "said" and "the" used in various embodiments of the present disclosure and the appended claims are also intended to include plural forms, unless the context clearly indicates other meanings.

It should be understood that the term "and/or" used in the present specification is only an association relationship describing associated objects, indicating that there can be three types of relationships. For example, A and/or B can indicate three cases including A alone, and both A and B, and B alone. In addition, the character "/" in the present specification normally indicates that before-after associated objects are in an "or" relationship.

Furthermore, unless otherwise clearly stated to the contrary, the "include" in the following description may be understood as including the elements, but not excluding any other elements.

Figure 1:
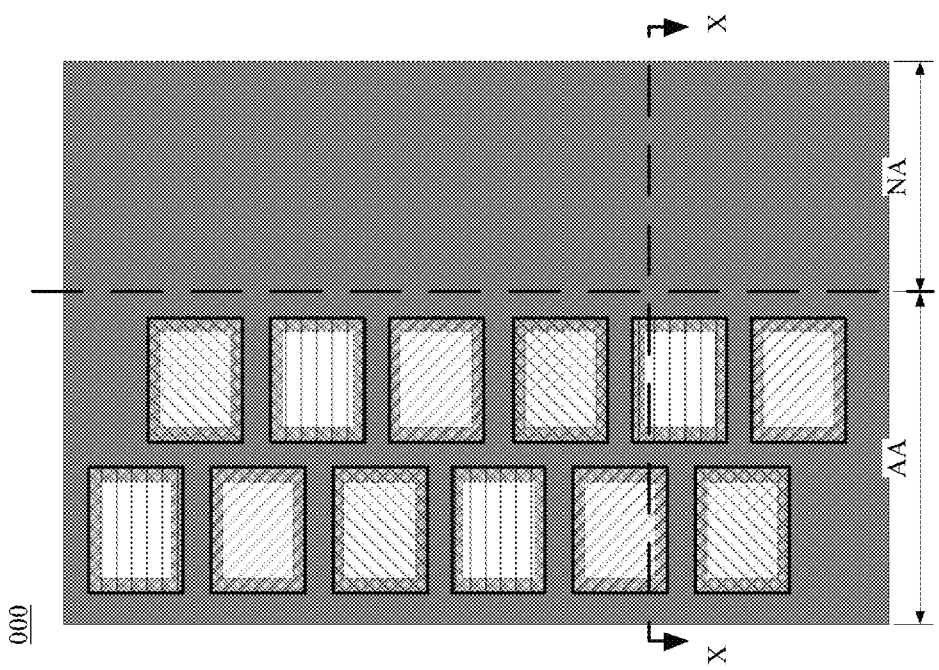
FIG. 1 illustrates a schematic of a display panel in the existing technology.
Figure 2:
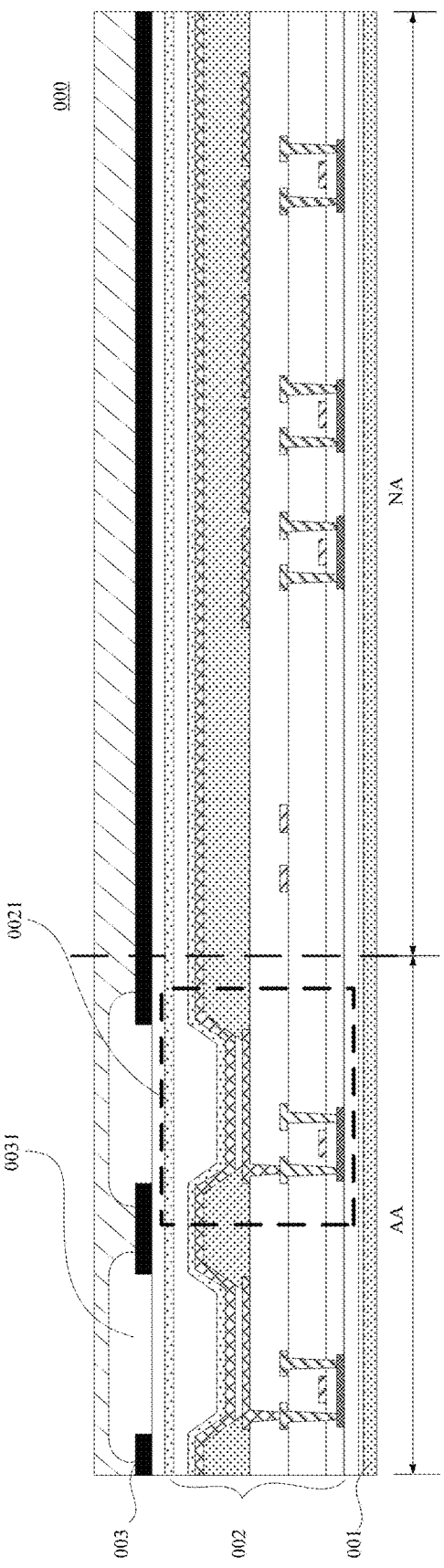
FIG. 2 illustrates a cross-sectional view of an X-X cross-section in FIG. 1.

Referring to FIGS. 1-2, FIG. 1 illustrates a schematic of a display panel in the existing technology; and FIG. 2 illustrates a cross-sectional view of an X-X cross-section in FIG. 1. As shown in FIGS. 1-2, a display panel 000 may include a display region AA and a non-display region NA; the non-display region NA may be located on at least one side of the display region AA; and along the light-exiting direction of the display panel 000, a substrate 001, a light-emitting unit layer 002 and a light-blocking layer 003 may be disposed sequentially.

The light-emitting unit layer 002 may be located on one side of the substrate 001; the light-emitting unit layer may include pixel units 0021 arranged in an array; and the pixel units 0021 may be located at the display region AA.

The light-blocking layer 003 may be located on one side of the light-emitting unit layer 002 away from the substrate 001, and the light-blocking layer 003 may include first openings 0031. The first openings 0031 may be located at the display region AA; and along the direction perpendicular to the substrate, and the pixel units 0021 may correspond to the first openings 0031.

It can be seen from FIGS. 1-2 that, in the existing technology, the morphology of the light-blocking layer 003 at the display region AA may be significantly different from the morphology of the light-blocking layer 003 at the non-display region NA. Such significant difference may cause the thicknesses of the film layers at the edge of the display region AA to change during a subsequent film layer formation process, resulting in inconsistent film thicknesses at the center and edge of the display region AA, thereby affecting the display uniformity of the entire display panel. Furthermore, the current development of display panels gradually moves toward integration, a touch-control layer and a color resist layer may be prepared directly above an encapsulation layer; and as the film layers are stacked sequentially, the thicknesses of the film layers at the edge may be further worsened, which may more obviously affect light-exiting of the display panel.

Figure 3:
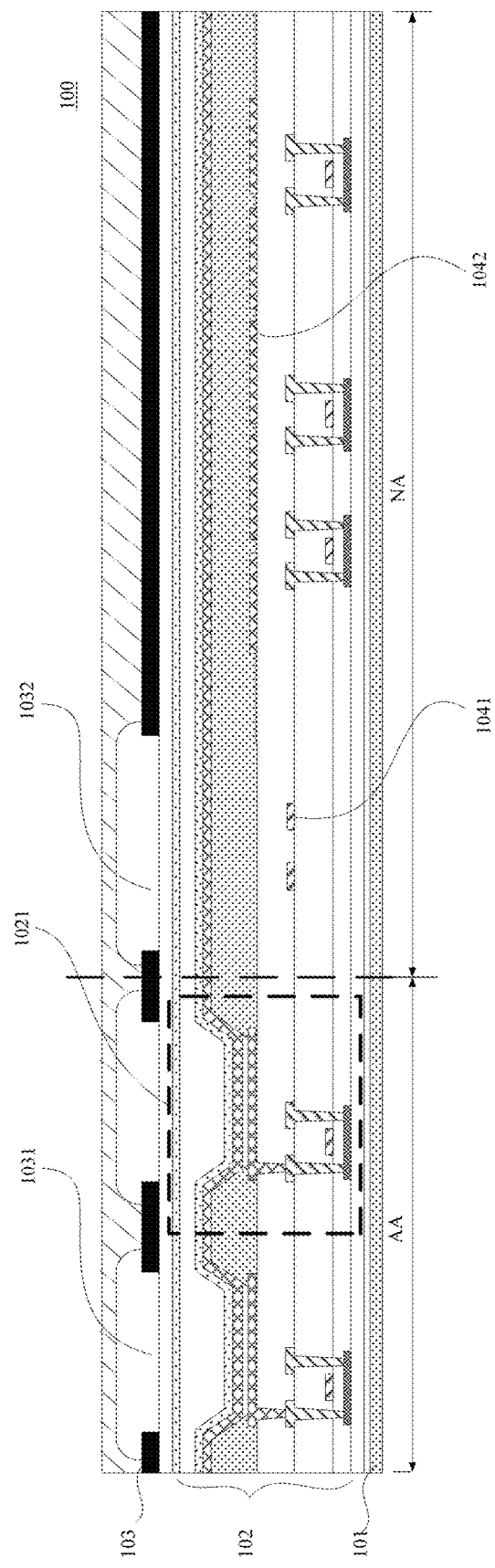
FIG. 3 illustrates a cross-sectional view of an exemplary display panel according to various embodiments of the present disclosure.

In order to solve the above-mentioned problem, FIG. 3 illustrates a cross-sectional view of an exemplary display panel according to various embodiments of the present disclosure. As shown in FIG. 3, one embodiment of the present disclosure provides a display panel 100. The display panel 100 may include a display region AA and a non-display region NA. The non-display region NA may be located on at least one side of the display region AA; and along the light-exiting direction of the display panel 100, a substrate 101, a light-emitting unit layer 102 and a light-blocking layer 103 may be disposed sequentially.

The light-emitting unit layer 102 may be located on one side of the substrate 101; the light-emitting unit layer may include pixel units 1021 arranged in an array; and the pixel units 1021 may be located at the display region AA.

The light-blocking layer 103 may be located on one side of the light-emitting unit layer 102 away from the substrate 101, and may include first openings 1031 and second openings 1032. The first openings 1031 may be located at the display region AA; and along the direction perpendicular to the substrate, the pixel units 1021 may correspond to the first openings 1031. The second openings 1032 may be located at least on one side of the non-display region NA adjacent to the display region AA. It should be noted that the quantity and size of the second openings 1032 in FIG. 3 may be merely for illustration. The arrangement manner of the second openings 1032 may be selected to be same as or different from the arrangement manner of the first openings 1031 of the display region AA, which may not be limited herein.

Figure 4:
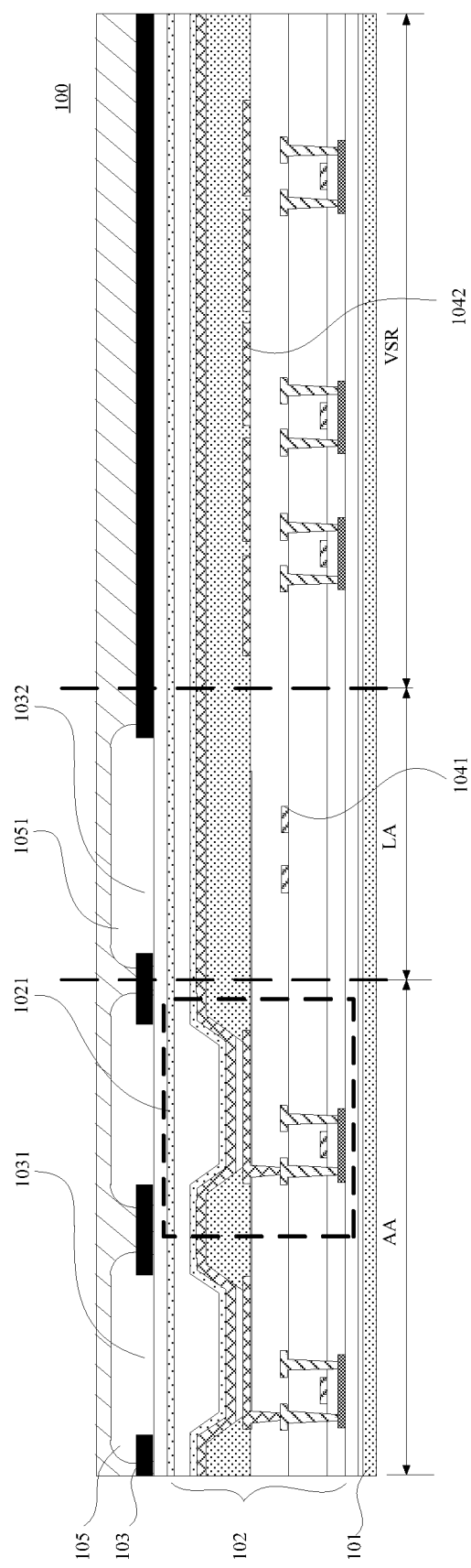
FIG. 4 illustrates a cross-sectional view of another exemplary display panel according to various embodiments of the present disclosure.

By disposing the second openings 1032 of the light-blocking layer 103 at the non-display region NA, a sufficient transition region may be provided. After the light-blocking layer 103 is patterned, the region with uneven film thickness that should be located at the display region AA may be moved to the non-display region NA when the upper film layers continue to be stacked, thereby increasing the display uniformity of the entire display region AA. Since the second openings 1032 are located at the non-display region NA, the region with uneven film thickness corresponding to the second openings may not affect the display effect. In one embodiment, FIG. 4 illustrates a cross-sectional view of another exemplary display panel according to various embodiments of the present disclosure. The non-display region may include a wiring region LA and a driving circuit region VSR. The wiring region LA may be adjacent to the display region AA, and the driving circuit region VSR may be located on one side of the wiring region LA away from the display region AA.

The pixel circuit at the display region AA may be electrically connected to the driving circuit in the driving circuit region VSR through various signal wires 1041. It should be understood that the wiring region LA may not include display pixels or any components in the driving circuit, but only include a part of the signal wires 1041.

The second openings 1032 may be located at least at the wiring region LA. Since large-surface metal 1042 may be included in the driving circuit region VSR, if the second openings 1032 in the light-blocking layer 103 are directly extended to the driving circuit region VSR, the reflectivity of the entire display panel may increase. Therefore, the second openings 1032 of the light-blocking layer 103 at the non-display region may be more disposed at the wiring region LA for transition, which can take into account both the display uniformity and the overall reflectivity of the display panel.

In one embodiment, as shown in FIG. 4, the arrangement pattern of the second openings 1032 at the wiring region LA may be same as the arrangement pattern of the pixel units 1021. Since the first openings 1031 correspond to the pixel units 1021 in a one-to-one relationship and the quantity of the first openings 1031 is same as the quantity of the pixel units 1021, setting the arrangement pattern of the second openings 1032 at the wiring region LA to be same as the arrangement pattern of the pixel units 1021 may further balance the difference between the second openings 1032 and the first openings 1031 at the wiring region LA. In such way, when the boundary of the opening region of the light-blocking layer 103 is expanded and upper film layers continue to be stacked, the region with uneven film thicknesses that should be located at the display region AA may be moved to the non-display region NA, which may prevent the region with uneven film thicknesses from being excessively large to affect the display effect of the display region AA, thereby further increasing the display uniformity of the entire display region AA.

In one embodiment, as shown in FIG. 4, the display panel 100 may further include a color resist layer 105. The color resist layer 105 may be located on one side of the light-emitting unit layer 102 away from the substrate 101; and the color resist layer 105 may include color resist units 1051 arranged in an array. Along the direction perpendicular to the substrate, the projection of the color resist units 1051 on the light-blocking layer may at least cover the first openings 1031 and a part of the second openings 1032.

By disposing the second openings 1032 at the non-display region NA and covering the second openings 1032 with the color resist units 1051, the region where the second openings 1032 are disposed may be similar to the filter structure of the display region AA, which may reduce the reflectivity difference between the non-display region NA and the display region AA of the display panel 100, further reduce the appearance difference between the non-display region NA and the display region AA of the display panel 100 when the display backlight is off, improve the appearance consistency of the display panel 100 within the visible range of human eyes when the display backlight is off, and realize the integrative black effect of the frame when the display backlight is off.

Figure 5:
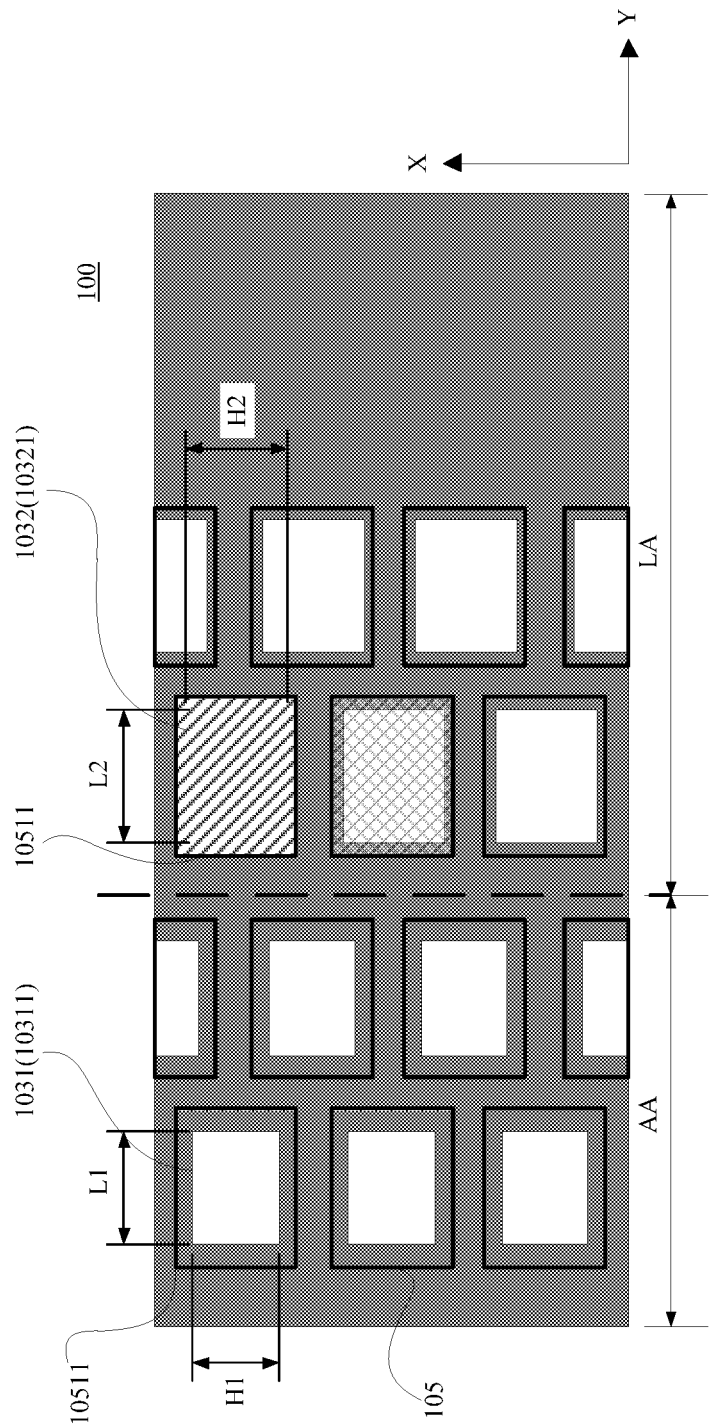
FIG. 5 illustrates a schematic of an exemplary display panel according to various embodiments of the present disclosure.

In one embodiment, FIG. 5 illustrates a schematic of an exemplary display panel according to various embodiments of the present disclosure. The color resist layer 105 may include a plurality of first-color color resists 10511; and the first-color color resists 10511 may refer to all color resist blocks of a same color in the display panel.

The first opening 1031 may include a first sub-opening 10311; and along the direction perpendicular to the substrate, the first sub-opening 10311 may correspond to one first-color color resist 10511.

The second opening 1032 may include a second sub-opening 10321; and along the direction perpendicular to the substrate, and the second sub-opening 10321 may correspond to one first-color color resist 10511.

The opening area of the second sub-opening 10321 at the wiring region LA may be greater than or equal to the opening area of the first sub-opening 10311.

As shown in FIG. 5, the first sub-opening 10311 and the second sub-opening 10321 are both rectangular, so that the opening area of the first sub-opening 10311 is $S1=L1 \times H1$, and the opening area of the second sub-opening 10321 is $S2=L2 \times H2$ where $S1 \leq S2$. Since the signal wiring at the wiring region LA is normally horizontal, it should at least satisfy the following: $L1<L2$. L1 and L2 are the dimensions of the first sub-opening 10311 and the second sub-opening 10321 along a second direction Y respectively; and H1 and H2 are the dimensions of the first sub-opening 10311 and the second sub-opening 10321 along a first direction X respectively. The first direction X and the second direction Y may be perpendicular to each other in a plane in parallel with the substrate 101. The shapes of the first sub-opening 10311 and the second sub-opening 10321 may include, but may not be limited to, the above-mentioned rectangles. Optionally, the second sub-opening 10321 may be a similar shape of the first sub-opening 10311. For example, similar shapes may be rectangles with different widths and lengths. Optionally, the second sub-opening 10321 and the first sub-opening 10311 may have completely different shapes, as long as it may satisfy that the opening area of the second sub-opening 10321 at the wiring region LA is greater than or equal to the opening area of the first sub-opening 10311.

As shown in FIG. 6, FIG. 6 illustrates a cross-sectional view of another exemplary display panel according to various embodiments of the present disclosure. The light-emitting unit layer 102 may include a pixel defining layer 1022. The pixel defining layer 1022 may include a plurality of pixel openings arranged in an array. The pixel units 1021 may correspond to the pixel openings in a one-to-one relationship, and may be disposed in the pixel openings. The pixel unit 1021 may be the smallest repeating unit for displaying. Along the light-exiting direction of the display panel, the pixel unit 1021 may include a first electrode 10211, a light-emitting layer 10212, and a second electrode 10213 which are stacked sequentially. In order to make the organic light-emitting diode device emit light to the top, the first electrode 10211 at the bottom of the light-emitting layer 10212 may be made of a metal material; the light emitted from the light-emitting layer 10212 may be reflected by the first electrode 10211 after being incident on the first electrode 10211, such that the light may be finally emitted to the top. Meanwhile, due to the strong light-reflective properties of metal, when external light enters the OLED display panel when the display backlight is in an off-state, the first electrode 10211 exposed by the first opening 1031 may reflect the external light back.

Since the second opening 1032 is at least located at the wiring region LA of the non-display region NA, the second opening 1032 may expose the metal signal wires 1041 at a lower side. In order to ensure the reflectivity difference between the non-display region NA and the display region AA of the display panel 100, the opening area of the second sub-opening 10321 at the wiring region LA may be set to be greater than or equal to the opening area of the first sub-opening 10311. In such way, it may ensure that the metal area exposed by the second opening 1032 in a unit area may be similar to the metal area exposed by the first opening 1031 in the same unit area. Therefore, the reflectivity difference of various positions of the display panel 100 may be small when the display backlight is in an off-state, and the appearance difference between the non-display region NA and the display region AA of the display panel 100 may be further reduced when the display backlight is off, which may improve the appearance consistency of the display panel 100 within the visible range of human eyes when the display backlight is off, and realize the integrative black effect of the frame when the display backlight is off.

As shown in FIGS. 6-7, FIG. 7 illustrates a cross-sectional view of another exemplary display panel according to various embodiments of the present disclosure. The wiring region LA may further include at least one reflecting unit 1043. The reflecting unit 1043 may be located on the side of the light-blocking layer 103 adjacent to the substrate 101; and the projection of the reflecting unit 1043 on the light-blocking layer 103 may overlap the second opening 1032. Since the signal wires 1041 at the wiring region LA are not evenly distributed, the reflecting unit 1043 may be additional disposed to further balance the metal area exposed by each second opening 1032 at the wiring region LA, such that the area of the reflecting unit 1043 exposed by a single second opening 1032 may be approximately equal to the area of the first electrode 10211 exposed by the pixel opening at the pixel defining layer 1022.

In the above-mentioned embodiments and drawings, the areas of the first openings corresponding to the color resists of different colors on the display panel may be same as an example. However, in an actual display panel, the areas of the first openings corresponding to the color resists of different colors may be different. Therefore, it is necessary to compare the openings corresponding to the color resists of a same color to have practical significance. Taking the openings corresponding to all of the first-color color resists 10511 on the display panel as an example, the area of the reflecting unit 1043 exposed by the second sub-opening 10321 may be set to be similar to the area of the first electrode 10211 exposed by the first sub-opening 10311. In such way, it may ensure that the metal area exposed by the second opening 1032 in a unit area may be similar to the metal area exposed by the first opening 1031 in the same unit area. Therefore, the reflectivity difference of various positions of the display panel 100 may be small when the display backlight is in an off-state, and the appearance difference between the non-display region NA and the display region AA of the display panel 100 may be further reduced when the display backlight is off, which may improve the appearance consistency of the display panel 100 within the visible range of human eyes when the display backlight is off, and realize the integrative black effect of the frame when the display backlight is off.

As shown in FIG. 6, the light-emitting unit layer 102 may further include a semiconductor layer 10214, a first metal layer 10215, and a second metal layer 10216 which are sequentially arranged along the direction away from the substrate 101. A gate electrode insulating layer may also be disposed between the semiconductor layer 10214 and the first metal layer 10215, and an interlayer insulating layer may also be disposed between the first metal layer 10215 and the second metal layer 10216. The gate electrode insulating layer and the interlayer insulating layer may be inorganic layers made of silicon oxide, silicon nitride or metal oxide. The reflecting unit 1043 may be made of a same material at a same layer as the first metal layer 10215 to save processing steps.

As shown in FIG. 7, the light-emitting unit layer 102 may further include a driving array located on one side of the first electrode 10211 adjacent to the substrate 101, and the driving array may include at least one thin film transistor. A light-blocking metal layer 10217 may be also disposed on the side of the driving array adjacent to the substrate 101. The light-blocking metal layer 10217 may achieve a light-blocking effect to prevent external light from affecting the mobility of carriers in the semiconductor layer 10214. The light-blocking metal layer 10217 may be made of a metal material with desirable light-blocking properties such as copper, aluminum, iron and the like. The reflecting unit 1043 may be made of a same material at a same layer as the light-blocking metal layer 10217 to save processing steps.

Figure 8:
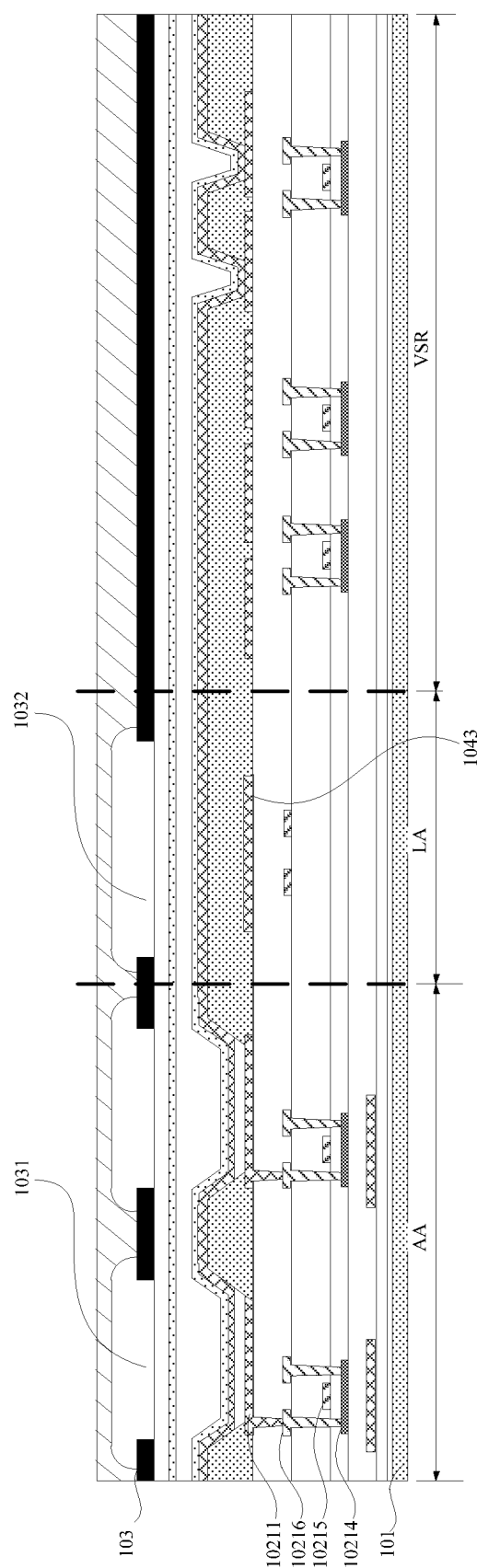
FIG. 8 illustrates a cross-sectional view of another exemplary display panel according to various embodiments of the present disclosure.

Similarly, as shown in FIG. 8, FIG. 8 illustrates a cross-sectional view of another exemplary display panel according to various embodiments of the present disclosure. The reflecting unit 1043 may also be made of a same material at a same layer as the first electrode 10211 to save processing steps. The first electrode 10211 may be made of ITO-Ag-ITO and the first metal layer 10215 may be made of molybdenum, such that a certain reflectivity difference may be between the first electrode 10211 and the first metal layer 10215. Therefore, in order to further reduce the reflectivity difference in various positions of the display panel 100 when the display backlight is in an off-state, optionally, the reflecting unit 1043 and the first electrode 10211 may be made of a same material at a same layer. In such way, it may ensure that the metal area exposed by the second opening 1032 in a unit area may be similar to the metal area exposed by the first opening 1031 in the same unit area and the metal reflectivity of the exposed portions may be same. Therefore, the appearance difference between the non-display region NA and the display region AA of the display panel 100 may be further reduced when the display backlight is off, which may improve the appearance consistency of the display panel 100 within the visible range of human eyes when the display backlight is off, and realize the integrative black effect of the frame when the display backlight is off.

Figure 9:
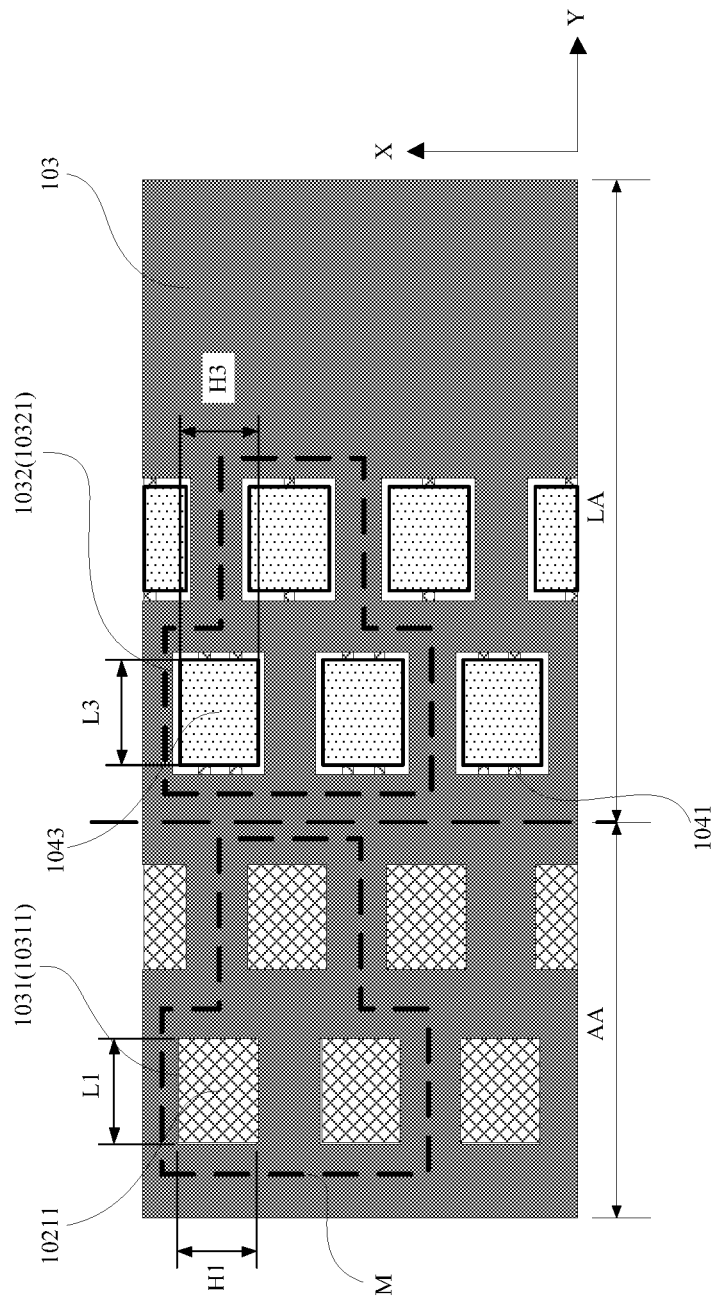
FIG. 9 illustrates a schematic of another exemplary display panel according to various embodiments of the present disclosure.

As shown in FIG. 9, FIG. 9 illustrates a schematic of another exemplary display panel according to various embodiments of the present disclosure. The pixel units, the first openings 1031 and the second openings 1032 may all be arranged in an array using a smallest repeating unit M. The pixel units may include first sub-pixels; and along the direction perpendicular to the substrate, and the first sub-pixels may correspond to the first sub-openings 10311 in a one-to-one relationship and the quantity of the first sub-pixels may be same as the quantity of the first sub-openings 10311. If the projection of the first electrode 10211 on the light-blocking layer 103 is located in the first sub-opening 10311, the area of the first electrode 10211 may be less than the opening size of the first sub-opening 10311 at this point, and the first electrode 10211 may be completely exposed by the first sub-opening 10311. When the area of the reflecting unit 1043 is equal to the area of the first electrode 10211, the metal area exposed by the second opening 1032 in a unit area may be similar to the metal area exposed by the first opening 1031 in the same unit area. The opening area of the second opening 1032 is larger than the area of the reflecting unit 1043, such that a gap may be between the edge of the second opening 1032 and the edge of the reflecting unit 1043, and such gap may expose a part of the signal wires 1041. Therefore, in order to balance the exposed metal areas, the area of the reflecting unit 1043 can also be set to be less than the area of the first electrode 10211.

Similarly, when the area of the first electrode 10211 is greater than the opening size of the first sub-opening 10311, the metal area of the first electrode 10211 exposed by the first sub-opening 10311 may be equal to the opening size of the first sub-opening 10311, such that the area of the reflecting unit 1043 can be set to be less than or equal to the opening area S1 of the first sub-opening 10311. Taking the first sub-opening 10311 and the second sub-opening 10321 both being rectangles as an example, the opening area of the first sub-opening 10311 is $S1=L1 \times H1$, and the area of the reflecting unit 1043 is $S3=L3 \times H3$, where $S1 \geq S3$. L1 and L3 are the dimensions of the first sub-opening 10311 and the reflecting unit 1043 along the second direction Y respectively; and H1 and H3 are the dimensions of the first sub-opening 10311 and the reflecting unit 1043 along the first direction X respectively. The first direction X and the second direction Y may be perpendicular to each other in the plane in parallel with the substrate 101. The shapes of the first sub-opening 10311 and the reflecting unit 1043 may include, but may not be limited to, the above-mentioned rectangles. Optionally, the reflecting unit 1043 may be a similar shape of the first sub-opening 10311 or the first electrode 10211. Optionally, the reflecting unit 1043 and the first sub-opening 10311 may also have completely different shapes.

Figure 10:
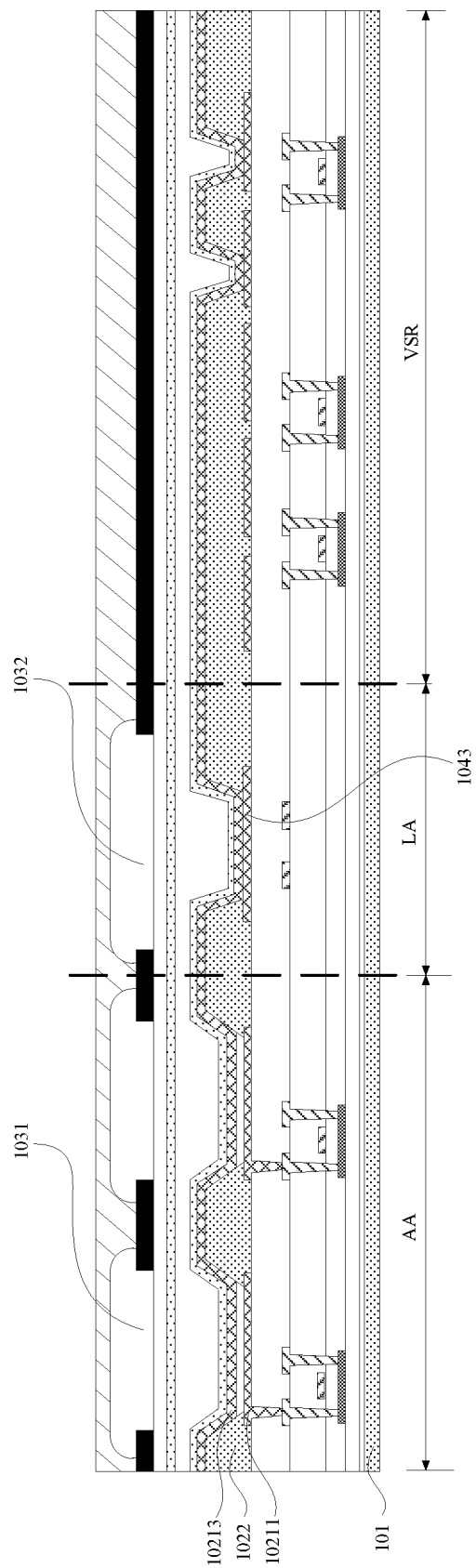
FIG. 10 illustrates a cross-sectional view of another exemplary display panel according to various embodiments of the present disclosure.

As shown in FIG. 10, FIG. 10 illustrates a cross-sectional view of another exemplary display panel according to various embodiments of the present disclosure. The pixel defining layer 1022 may be disposed with a first through hole at the position of the reflecting unit 1043, such that the reflecting unit 1043 may be electrically connected to the second electrode 10213. Furthermore, the opening area of the first through hole on the side adjacent to the substrate 101 may be similar to the area of the reflecting unit 1043, which may increase the contact area between the second electrode 10213 in the first through hole and the reflecting unit 1043, and reduce the resistance of the second electrode 10213, thereby effectively ensuring the display effect of the display panel.

Figure 11:
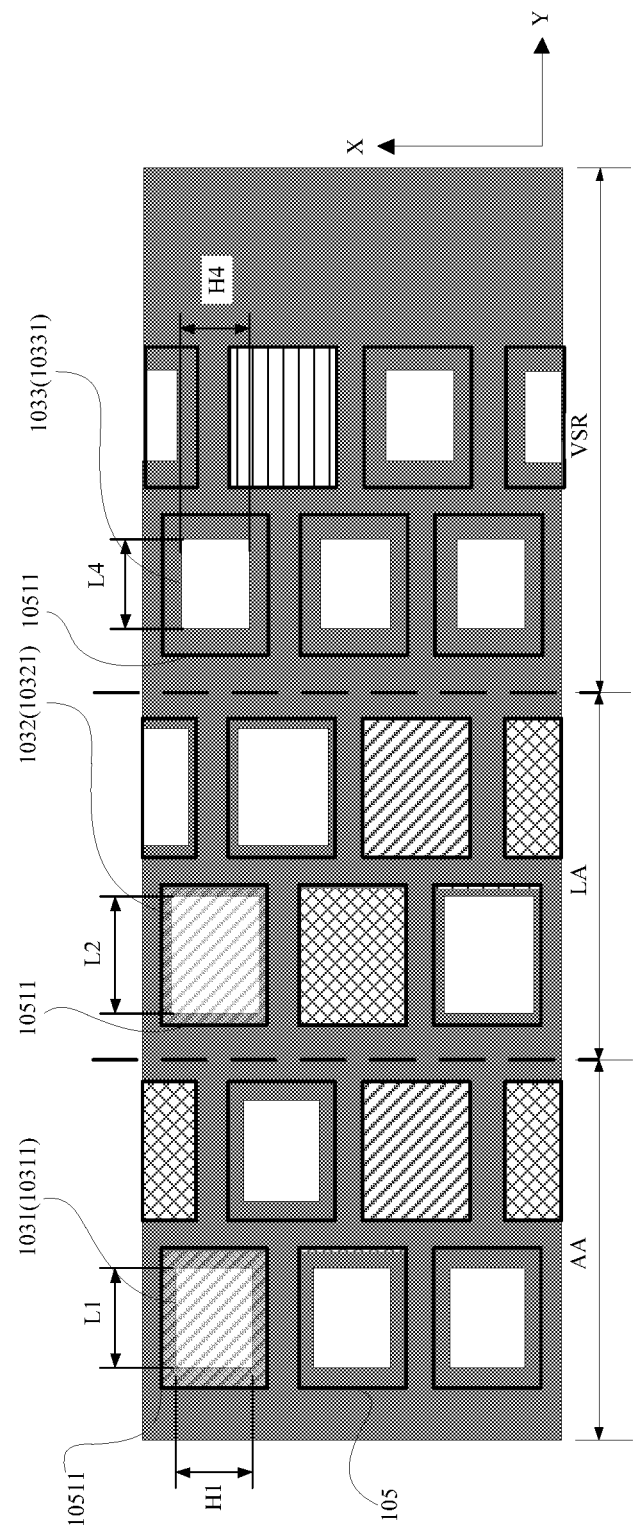
FIG. 11 illustrates a schematic of another exemplary display panel according to various embodiments of the present disclosure.
Figure 12:
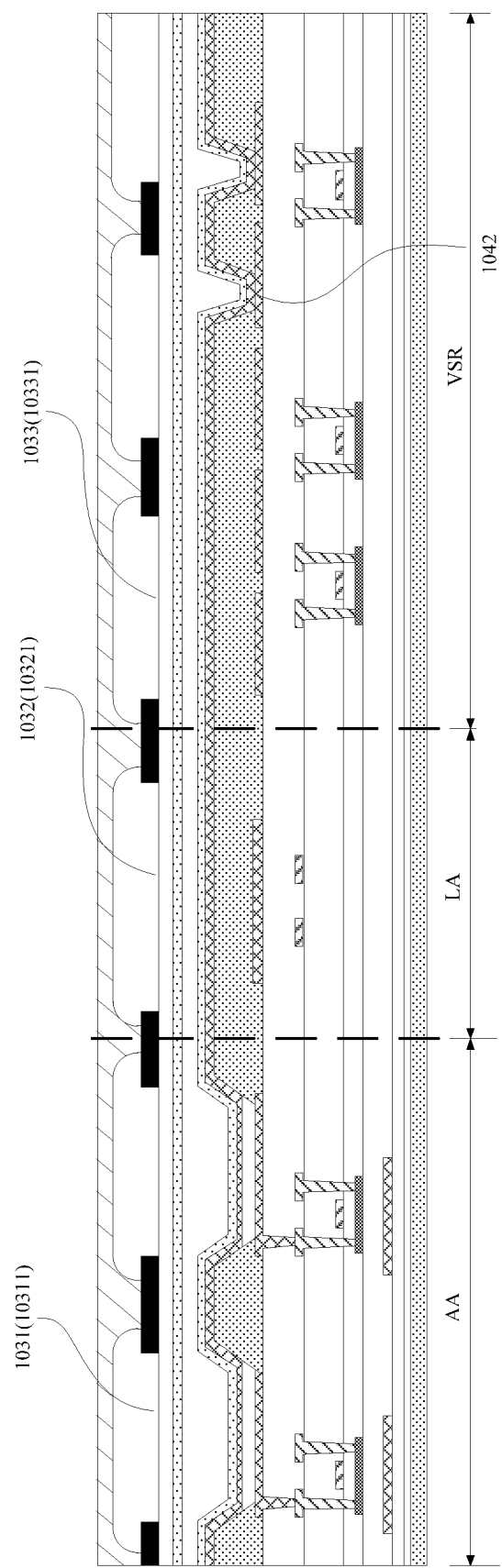
FIG. 12 illustrates a cross-sectional view of another exemplary display panel according to various embodiments of the present disclosure.

As shown in FIGS. 11-12, FIG. 11 illustrates a schematic of another exemplary display panel according to various embodiments of the present disclosure; and FIG. 12 illustrates a cross-sectional view of another exemplary display panel according to various embodiments of the present disclosure. The light-blocking layer 103 may further include third openings 1033; and the third openings 1033 may be located in the driving circuit region VSR. Along the direction perpendicular to the substrate 101, the projection of the color resist unit 1051 on the light-blocking layer 103 may cover the third opening 1033. The third opening 1033 may include a third sub-opening 10331; and along the direction perpendicular to the substrate 101, the third sub-opening 10331 may correspond to one first-color resist 10511. The opening area of the third sub-opening 10331 may be less than the opening area of the first sub-opening 10311.

Since the large-surface metal 1042 exists in the driving circuit region VSR, if the third opening 1033 with the same area as the first opening 1031 is directly used, the reflectivity of the driving circuit region VSR may be relatively high. Also, the first sub-opening 10311 and the third sub-opening 10331 are assumed to be both rectangular, such that the opening area of the first sub-opening 10311 is $S1=L1 \times H1$, and the opening area of the third sub-opening 10331 is $S4=L4 \times H4$, where $S1>S4$. L1 and L4 are the dimensions of the first sub-opening 10311 and the third sub-opening 10331 along the second direction Y respectively; and H1 and H4 are the dimensions of the first sub-opening 10311 and the third sub-opening 10331 along the first direction X respectively. The first direction X and the second direction Y may be perpendicular to each other in the plane in parallel with the substrate 101. The shapes of the first sub-opening 10311 and the third sub-opening 10331 may include, but may not be limited to, the above-mentioned rectangles. Optionally, the third sub-opening 10331 may be a similar shape of the first sub-opening 10311. Optionally, the third sub-opening 10331 and the first sub-opening 10311 may have completely different shapes, as long as it may satisfy that the opening area of the third sub-opening 10331 is less than the opening area of the first sub-opening 10311.

In order to ensure the light-exiting efficiency, the opening area of the first opening 1031 is greater than the area of the first electrode 10211, such that the opening area of the third sub-opening 10331 may be set to be less than the opening area of the first sub-opening 10311. In such way, it may ensure that the metal area exposed by the third opening 1033 in a unit area may be similar to the metal area exposed by the first opening 1031 in the same unit area. Therefore, the reflectivity difference of various positions of the display panel 100 may be small when the display backlight is in an off-state, and the appearance difference between the non-display region NA and the display region AA of the display panel 100 may be further reduced when the display backlight is off, which may improve the appearance consistency of the display panel 100 within the visible range of human eyes when the display backlight is off, and realize the integrative black effect of the frame when the display backlight is off.

Figure 13:
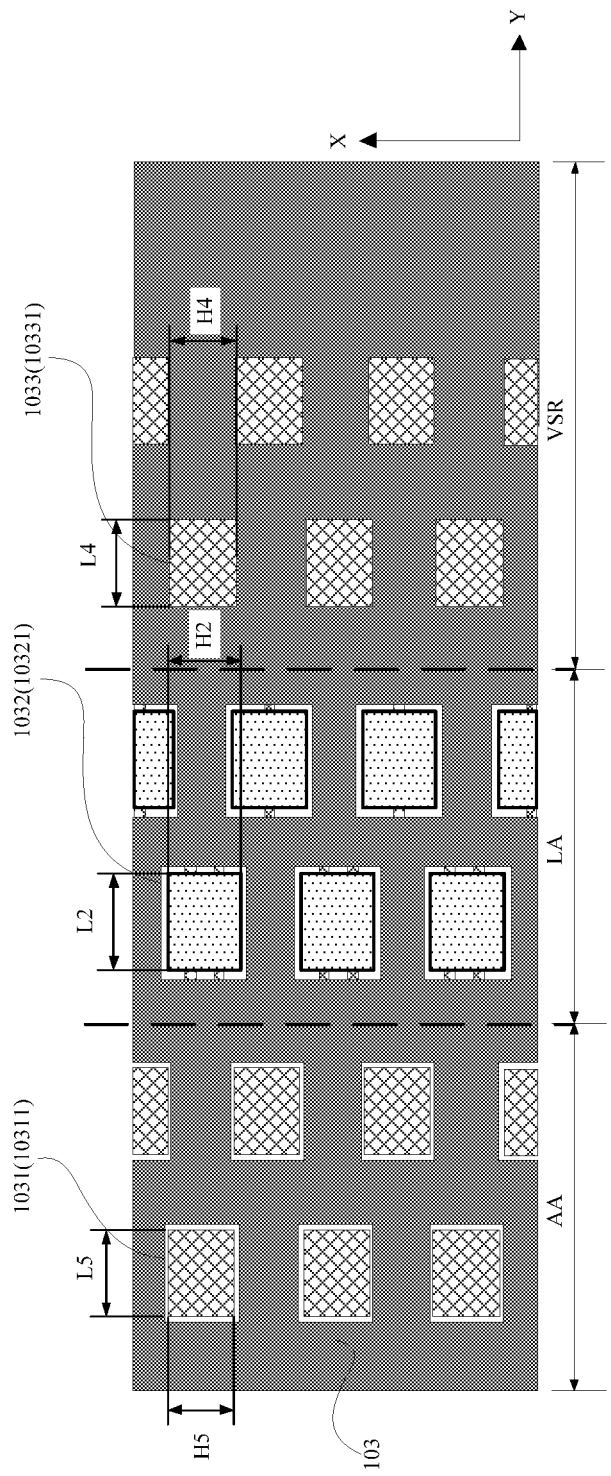
FIG. 13 illustrates a schematic of another exemplary display panel according to various embodiments of the present disclosure.

As shown in FIG. 13, FIG. 13 illustrates a schematic of another exemplary display panel according to various embodiments of the present disclosure. The pixel unit may include a first sub-pixel, and along the direction perpendicular to the substrate, the first sub-pixel may correspond to the first sub-opening 10311. The first sub-pixel may include the first electrode 10211, a light-emitting material, and the second electrode which are stacked sequentially; and the projection of the first electrode 10211 on the light-blocking layer 103 may be located in the first sub-opening 10311. The opening area of one or more of the third sub-openings 10331 may be equal to the area of the first electrode 10211.

In order to have uniform appearance transition of the display panel 100, at least the opening area of the third sub-opening 10331 adjacent to the second opening may be equal to the area of the first electrode 10211.

The first sub-opening 10311 and the third sub-opening 10331 are assumed to be both rectangular, such that the opening area of the first sub-opening 10311 is $S5=L5 \times H5$, and the opening area of the third sub-opening 10331 is $S4=L4 \times H4$, where $S4=S5$. L4 and L5 are the dimensions of the third sub-opening 10331 and the first electrode 10211 along the second direction Y respectively; and H4 and H5 are the dimensions of the third sub-opening 10331 and the first electrode 10211 along the first direction X respectively.

The first direction X and the second direction Y may be perpendicular to each other in the plane in parallel with the substrate 101. The shapes of the first sub-opening 10311 and the first electrode 10211 may include, but may not be limited to, the above-mentioned rectangles. Optionally, the third sub-opening 10331 may be a similar shape of the first electrode 10211. Optionally, the third sub-opening 10331 and the first electrode 10211 may have completely different shapes, as long as it may satisfy that the opening area of the third sub-opening 10331 is equal to the opening area of the first electrode 10211.

The first-color color resist may be a red color resist, a green color resist or a blue color resist. The opening area corresponding to the red color resist, the opening area corresponding to the green color resist, and the opening size corresponding to the blue color may all be different. Therefore, horizontal comparison of the openings corresponding to the color resists of a same color may be made in the present application. However, the present application may not be limited to that only the openings corresponding to the color resists of a same color satisfies the above-mentioned description, but it can be understood that all openings may be applicable to the above-mentioned rule.

Figure 14:
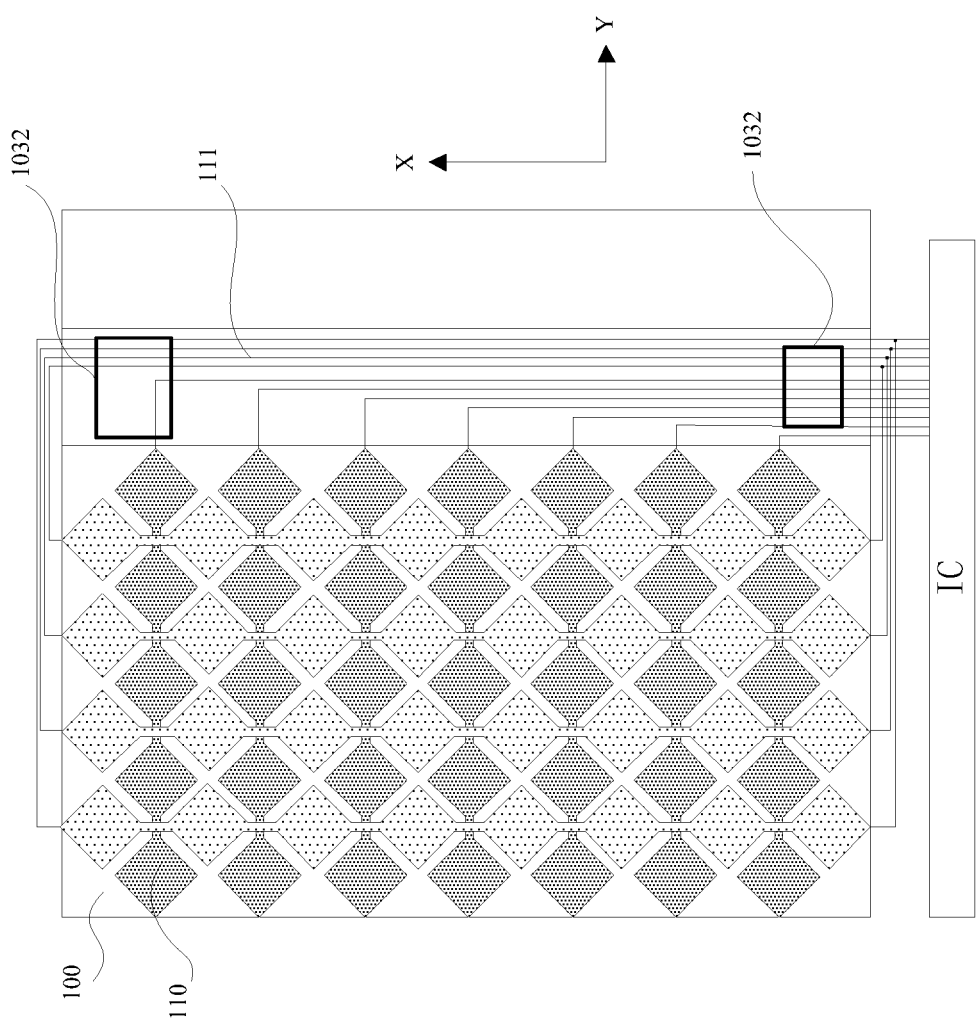
FIG. 14 illustrates a schematic of an exemplary display device according to various embodiments of the present disclosure.

In one embodiment of the present disclosure, as shown in FIG. 14, FIG. 14 illustrates a schematic of an exemplary display device according to various embodiments of the present disclosure. The present disclosure provides a display device, including the display panel 100 described in the above-mentioned embodiments and a driving chip IC located on the display panel. The display panel 100 may further include a touch-control layer 110; and the touch-control layer 110 may be located on the side of the light-blocking layer adjacent to the substrate. The touch-control layer 110 and the driving chip IC may be electrically connected through touch-control wires 111; and along the direction perpendicular to the substrate, the touch-control wires 111 may overlap the non-display region.

Along the first direction X, the opening areas of the second openings 1032 and/or the third openings 1033 may gradually increase, where the first direction X may be the direction pointing from the side of the display panel adjacent to the driving chip to the side of the display panel away from the driving chip.

When the touch-control wires 111 are located at the wiring region LA, along the first direction X, the density (e.g., the quantity in a unit area) of the touch-control wires 111 may gradually decrease, such that the opening areas of the second openings 1032 may be set to gradually increase. In such way, it may ensure that the metal area exposed by the second opening 1032 in a unit area may be similar to the metal area exposed by the first opening 1031 in the same unit area. Therefore, the reflectivity difference of various positions of the display panel 100 may be small when the display backlight is in an off-state, and the appearance difference between the non-display region NA and the display region AA of the display panel 100 may be further reduced when the display backlight is off, which may improve the appearance consistency of the display panel 100 within the visible range of human eyes when the display backlight is off, and realize the integrative black effect of the frame when the display backlight is off.

The opening areas of the second openings 1032 gradually increase, which can be understood as that, along the first direction X, the sum of the opening areas of all second openings 1032 in the smallest repeating unit M on the side adjacent to the driving chip may be less than the sum of the opening areas of all second openings 1032 in the smallest repeating unit M on the side far from the driving chip; or the average opening area of all second openings 1032 in the smallest repeating unit M on the side adjacent to the driving chip may be less than the average opening area of all second openings 1032 in the smallest repeating unit M on the side far from the driving chip.

Similarly, when the touch-control wires 111 are located in the driving circuit region VSR, the density of the touch leads 111 may gradually decrease along the first direction X, such that the opening areas of the third openings 1033 may be set to gradually increase. When the touch-control wires 111 are located in both the wiring region LA and the driving circuit region VSR, the density of the touch-control wires 111 may gradually decrease along the first direction X. Therefore, as the opening areas of the second openings 1032 are set to gradually increase, the opening areas of the third openings 1033 may also gradually increase, which may not be described in detail herein.

For example, the display device may be any products with a display function, which include, but are not limited to, the following categories: televisions, notebook computers, desktop displays, tablet computers, digital cameras, mobile phones, smart bracelets, smart glasses, vehicle monitors, medical equipment, industrial control equipment, touch interactive terminals and the like.

Figure 15:
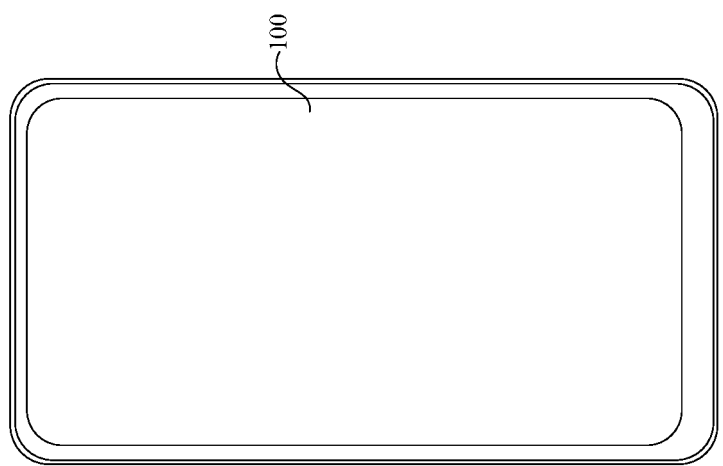
FIG. 15 illustrates a schematic of a display device according to various embodiments of the present disclosure.

FIG. 15 illustrates a schematic of a display device according to various embodiments of the present disclosure. A mobile phone may be taken as an example to schematically illustrate the display device of the present disclosure. The support films in the display device provided by the present disclosure may have the technical features described in any one of the above-mentioned embodiments. Therefore, the display device provided by the present disclosure may have the technical effects of the technical solutions in any one of the above-mentioned embodiments. The beneficial technical effects of the display device provided by the present disclosure may refer to the description in the above-mentioned embodiments, which may not be repeated in detail herein.

It should be noted that the above description may be a further detailed description of the present disclosure in conjunction with particular optional embodiments, and may not be considered that the actual implementation of the present disclosure is limited to these descriptions. For those skilled in the art, according to the technical field of the present disclosure, some simple deductions or substitutions may be made without departing from the concept of the present disclosure, which should be regarded as falling within the protection scope of the present disclosure.

What is claimed is:

1. A display panel, including a display region and a non-display region, where the non-display region is on at least one side of the display region, comprising:
    a substrate;
    a light-emitting unit layer on a side of the substrate, wherein the light-emitting unit layer includes pixel units, at the display region, arranged in an array; and
    a light-blocking layer on a side of the light-emitting unit layer away from the substrate, wherein the light-blocking layer includes first openings and second openings, wherein:
        the first openings are at the display region; and along a direction perpendicular to the substrate, the pixel units correspond to the first openings; and
        the second openings are at least on a side of the non-display region adjacent to the display region; and along a first direction, opening areas of the second openings gradually increase, wherein the first direction is a direction parallel to the substrate and parallel to a plane that separates the non-display region from the display region.

2. The display panel according to claim 1, wherein:
the non-display region includes a wiring region and a driving circuit region; the wiring region is adjacent to the display region; and the driving circuit region is on a side of the wiring region away from the display region; and
the second openings are at least at the wiring region.

3. The display panel according to claim 2, wherein:
an arrangement pattern of the second openings at the wiring region is same as an arrangement pattern of the pixel units.

4. The display panel according to claim 2, further including:
a color resist layer on the side of the light-emitting unit layer away from the substrate, wherein:
the color resist layer includes color resist units arranged in an array; and
along the direction perpendicular to the substrate, a projection of the color resist units on the light-blocking layer at least covers the second openings.

5. The display panel according to claim 4, wherein:
the color resist layer includes a plurality of first-color color resists;
along the direction perpendicular to the substrate, a first opening of the first openings corresponds to a first-color color resist of the plurality of first-color color resists;
along the direction perpendicular to the substrate, a second opening of the second openings corresponds to another first-color color resist of the plurality of first-color color resists; and
an opening area of the second opening at the wiring region is greater than or equal to an opening area of the first opening.

6. The display panel according to claim 5, wherein:
the light-blocking layer further includes third openings in the driving circuit region; and along the direction perpendicular to the substrate, the projection of the color resist units on the light-blocking layer covers the third openings;
along the direction perpendicular to the substrate, a third opening of the third openings corresponds to one first-color color resist of the plurality of first-color color resists; and
an opening area of the third opening is less than the opening area of the first opening.

7. The display panel according to claim 6, wherein:
a pixel unit of the pixel units includes a first sub-pixel; along the direction perpendicular to the substrate, the first sub-pixel corresponds to one first opening; the first sub-pixel includes a first electrode, a light-emitting material, and a second electrode which are stacked sequentially; and a projection of the first electrode on the light-blocking layer is in the one first opening; and
an opening area of one or more third openings is equal to an area of the first electrode.

8. The display panel according to claim 7, wherein:
a shape of the third opening and a shape of a projection of the first electrode on the substrate are the same.

9. The display panel according to claim 4, wherein:
the wiring region further includes at least one reflecting unit on a side of the light-blocking layer adjacent to the substrate; and a projection of a reflecting unit of the at least one reflecting unit on the light-blocking layer overlaps a second opening of the second openings.

10. The display panel according to claim 1, wherein:
a pixel unit of the pixel units includes a first sub-pixel; along the direction perpendicular to the substrate, the first sub-pixel corresponds to one first opening; the first sub-pixel includes a first electrode, a light-emitting material, and a second electrode which are stacked sequentially; and a projection of the first electrode on the light-blocking layer is in the one first opening; and
an area of a reflecting unit is less than an area of the first electrode.

11. The display panel according to claim 10, wherein:
a projection of the reflecting unit on the substrate and a projection of the first electrode on the substrate have same shapes.

12. The display panel according to claim 10, wherein:
the reflecting unit is electrically connected to the second electrode.

13. The display panel according to claim 10, wherein:
the reflecting unit and the first electrode are formed using a same material at a same processing layer.

14. The display panel according to claim 10, wherein:
the light-emitting unit layer further includes a driving array on a side of the first electrode adjacent to the substrate, and the driving array includes at least one thin film transistor;
a light-blocking metal layer is disposed on a side of the driving array adjacent to the substrate; and
the reflecting unit and the light-blocking metal layer are formed using a same material at a same processing layer.

15. A display device, comprising:
a display panel, including a display region and a non-display region, where the non-display region is on at least one side of the display region, comprising:
a substrate;
a light-emitting unit layer on a side of the substrate, wherein the light-emitting unit layer includes pixel units, at the display region, arranged in an array; and
a light-blocking layer on a side of the light-emitting unit layer away from the substrate, wherein the light-blocking layer includes first openings and second openings, wherein:
the first openings are at the display region; and along a direction perpendicular to the substrate, the pixel units correspond to the first openings; and
the second openings are at least on a side of the non-display region adjacent to the display region; and
a driving chip on the display panel, wherein:
the display panel further includes a touch-control layer on a side of the light-blocking layer adjacent to the substrate;
the touch-control layer and the driving chip are electrically connected with each other through touch-control wires; and along the direction perpendicular to the substrate, the touch-control wires overlap the non-display region; and
along a first direction, opening areas of the second openings gradually increase, wherein the first direction is a direction pointing from a side of the display panel adjacent to the driving chip to a side of the display panel away from the driving chip.

16. The display device according to claim 15, wherein:
the non-display region includes a wiring region and a driving circuit region; the wiring region is adjacent to the display region; and the driving circuit region is on a side of the wiring region away from the display region; and along the direction perpendicular to the substrate, the touch-control wires overlap the wiring region.

17. The display device according to claim 15, wherein:

the non-display region includes a wiring region and a driving circuit region; the wiring region is adjacent to the display region; and the driving circuit region is on a side of the wiring region away from the display region; and the second openings are at least at the wiring region.

18. The display device according to claim 17, wherein:

the display panel further includes a color resist layer on the side of the light-emitting unit layer away from the substrate, wherein:

the color resist layer includes color resist units arranged in an array; and along the direction perpendicular to the substrate, a projection of the color resist units on the light-blocking layer at least covers the second openings.

19. The display device according to claim 18, wherein:

the wiring region further includes at least one reflecting unit on a side of the light-blocking layer adjacent to the substrate; and a projection of a reflecting unit of the at least one reflecting unit on the light-blocking layer overlaps a second opening of the second openings.

20. The display device according to claim 19, wherein:

a pixel unit of the pixel units includes a first sub-pixel; along the direction perpendicular to the substrate, the first sub-pixel corresponds to one first opening; the first sub-pixel includes a first electrode, a light-emitting material, and a second electrode which are stacked sequentially; and a projection of the first electrode on the light-blocking layer is in the one first opening; and an area of the reflecting unit is less than an area of the first electrode.

* * * * *